(12) United States Patent
Nakamura et al.

(10) Patent No.: US 8,093,852 B2
(45) Date of Patent: Jan. 10, 2012

(54) MOTOR CONTROL DEVICE

(75) Inventors: Yasushi Nakamura, Nishio (JP); Keita Mutsuura, Anjo (JP); Kazuo Aoki, Anjou (JP)

(73) Assignee: Aisin AW Co., Ltd., Anjo (JP)

( * ) Notice: Subject to any disclaimer, the term of this patent is extended or adjusted under 35 U.S.C. 154(b) by 597 days.

(21) Appl. No.: 12/292,040

(22) Filed: Nov. 10, 2008

(65) Prior Publication Data

US 2009/0174353 A1    Jul. 9, 2009

(30) Foreign Application Priority Data

Nov. 20, 2007    (JP) .................................. 2007-300611

(51) Int. Cl.
*H02M 1/092*    (2006.01)
*H02M 7/48*    (2007.01)
*H02P 27/06*    (2006.01)

(52) U.S. Cl. ...................... 318/479; 318/471; 318/504

(58) Field of Classification Search .......... 318/400.26–400.28, 400.3, 471–473, 318/479, 504; 257/499, 500
See application file for complete search history.

(56) References Cited

U.S. PATENT DOCUMENTS

| | | | | |
|---|---|---|---|---|
| 4,859,921 A | * | 8/1989 | Archer | 318/599 |
| 5,646,534 A | * | 7/1997 | Kopera | 324/434 |
| 5,914,577 A | * | 6/1999 | Furnival | 318/538 |
| 5,932,942 A | * | 8/1999 | Patyk et al. | 310/58 |
| 7,298,027 B2 | * | 11/2007 | Yea et al. | 257/666 |
| 7,535,737 B2 | * | 5/2009 | Mechi | 363/37 |
| 7,777,433 B2 | * | 8/2010 | Yamaguchi et al. | 318/139 |
| 2005/0284673 A1 | * | 12/2005 | Nakazawa et al. | 180/65.1 |

FOREIGN PATENT DOCUMENTS

| | | |
|---|---|---|
| JP | U-05-018295 | 3/1993 |
| JP | A-11-178356 | 7/1999 |
| JP | A-2003-133932 | 5/2003 |
| JP | A-2006-081309 | 3/2006 |
| JP | A-2006-280148 | 10/2006 |
| JP | A-2007-189801 | 7/2007 |
| JP | A-2008-118815 | 5/2008 |

\* cited by examiner

*Primary Examiner* — Bentsu Ro
(74) *Attorney, Agent, or Firm* — Oliff & Berridge, PLC (57) ABSTRACT

A motor control device has a plurality of drive circuits that are respectively provided on arms of an inverter circuit that supplies current to an AC motor, the plurality of drive circuits driving respectively a plurality of switching elements included on the arms; a power source control circuit that performs a control of a plurality of power supply circuits that supply power respectively to the plurality of drive circuits; a low-voltage circuit area that includes the power source control circuit; a plurality of high-voltage circuit areas, each high-voltage circuit area including a drive circuit from the plurality of drive circuits; and a plurality of transformers that serve as the plurality of power supply circuits and respectively join the low-voltage circuit area and the plurality of high-voltage circuit areas in an insulated state.

20 Claims, 6 Drawing Sheets

MOTOR CONTROL DEVICE

INCORPORATION BY REFERENCE

The disclosure of Japanese Patent Application No. 2007-300611 filed on Nov. 20, 2007 including the specification, drawings and abstract is incorporated herein by reference in its entirety.

BACKGROUND

The present invention relates to a motor control device for controlling an AC motor.

A high-output motor used for powering an electric vehicle, hybrid vehicle, or the like is driven at a high voltage. Since a DC battery is mounted as a power source mounted in such a vehicle, the current is converted into a three-phase AC current by an inverter circuit that uses a switching element such as an insulated gate bipolar transistor (IGBT). A signal for driving the inverter circuit, e.g. a drive signal for driving a gate of the IGBT, is generated in a control circuit of a low-voltage circuit that is insulated from a high-voltage circuit driving the motor, and operates at a much lower voltage than that of the high-voltage circuit.

Figure 6:
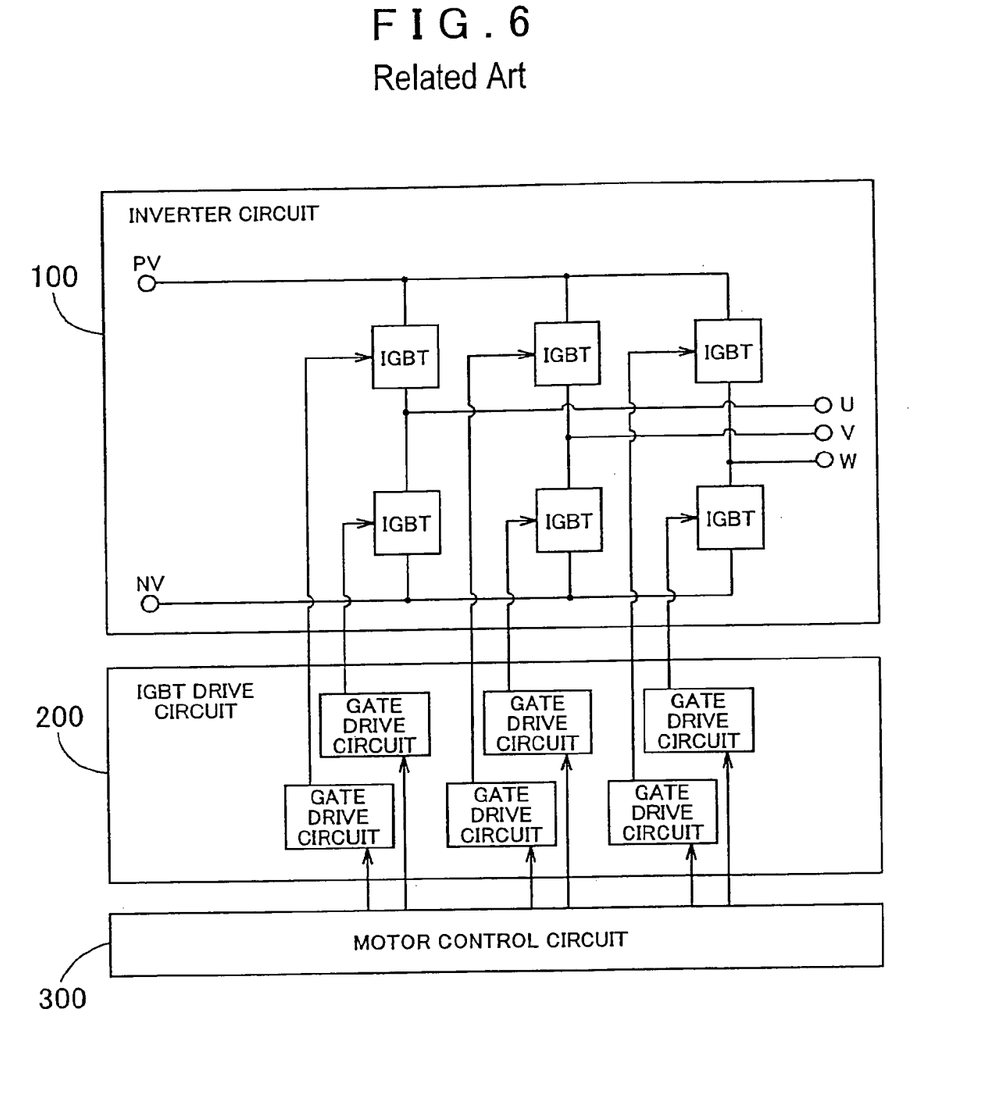
FIG. 6 is a block diagram schematically showing a structure of a conventional motor control device.

Accordingly, a motor control device driving the motor is provided with an IGBT drive circuit for driving the IGBT of the inverter circuit based on the drive signal. In other words, as illustrated in FIG. 6, the motor control device is structured having a motor control circuit 300 that operates within the low-voltage circuit; an IGBT drive circuit 200 that operates within the high-voltage circuit and drives the IGBT based on a drive signal generated by the motor control circuit 300; and an inverter circuit 100 that is structured from a plurality of IGBTs.

The inverter circuit 100 generating a three-phase AC current is structured from six IGBTs. The respective IGBTs operate independently, and gate drive circuits for driving the gates of the IGBTs are thus provided mutually independent in the IGBT drive circuit 200. Since the IGBTs handle a high voltage, the gate drive circuits driving the IGBTs must be arranged having a suitable insulation distance.

Japanese Patent Application Publication No. JP-A-2006-280148 (paragraphs 13 and 15, FIG. 1, etc.) discloses a voltage control device that is provided with a plurality of gate drive circuits for driving a plurality of IGBTs. According to JP-A-2006-280148 a control circuit and the gate drive circuit are disposed at least separated by an insulation distance that corresponds to a distance between an input pin and an output pin of a transformer. The gate drive circuits are also disposed separated by a predetermined insulation distance.

SUMMARY

The voltage control device disclosed in JP-A-2006-280148 has three gate drive circuits; however, six gate drive circuits must be provided in an inverter circuit generating a three-phase AC current. Simply aligning two of the voltage control devices according to JP-A-2006-280148 enlarges an insulation area where components cannot be mounted, and unnecessarily increases the surface area of the substrate.

The present invention was conceived in light of the foregoing issue, and it is an object of the present invention to provide a control device for an AC motor that is capable of securing insulation between a low-voltage circuit and a high-voltage circuit, while also achieving a compact size. The present invention can also achieve various other advantages.

In order to achieve the above object, a motor control device according to the present invention has a characteristic structure including a plurality of drive circuits that are respectively provided on arms of an inverter circuit that supplies current to an AC motor, the plurality of drive circuits driving respectively a plurality of switching elements included on the arms; a power source control circuit that performs a control of a plurality of power supply circuits that supply power respectively to the plurality of drive circuits; a low-voltage circuit area that includes the power source control circuit; a plurality of high-voltage circuit areas, each high-voltage circuit area including a drive circuit from the plurality of drive circuits; and a plurality of transformers that serve as the plurality of power supply circuits and respectively join the low-voltage circuit area and the plurality of high-voltage circuit areas in an insulated state, wherein the plurality of the high-voltage circuit areas are disposed aligned on both sides of the low-voltage circuit area such that the low-voltage circuit area is provided between the plurality of high-voltage areas and oriented with a predetermined insulation distance provided between the plurality of high-voltage circuit areas and the low-voltage circuit area.

BRIEF DESCRIPTION OF THE DRAWINGS

Exemplary embodiments of the invention will now be described with reference to the accompanying drawings, wherein.

DETAILED DESCRIPTION OF EMBODIMENTS

Figure 1:
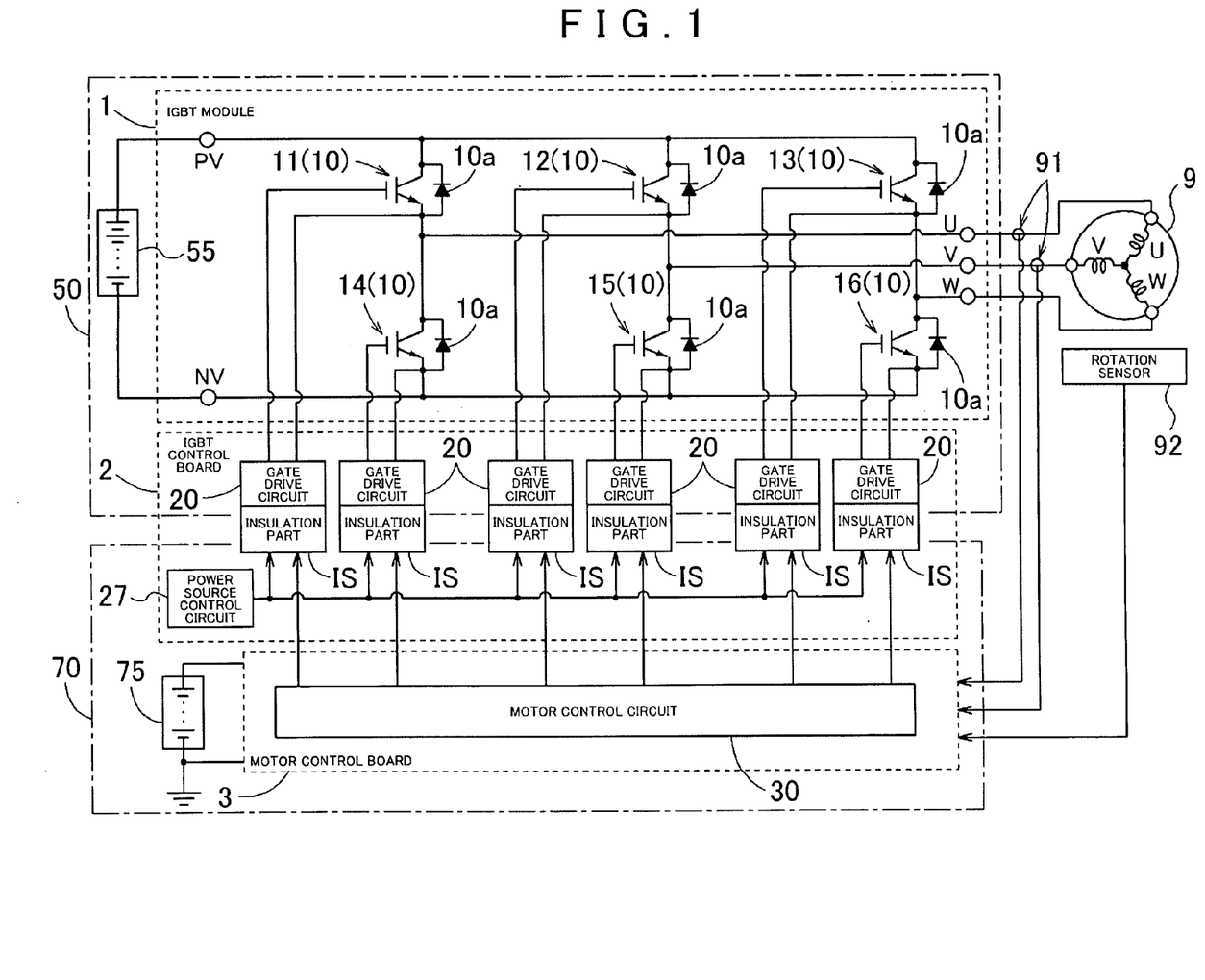
FIG. 1 is a block diagram schematically showing a circuit configuration of a motor control circuit according to the present invention.
Figure 2:
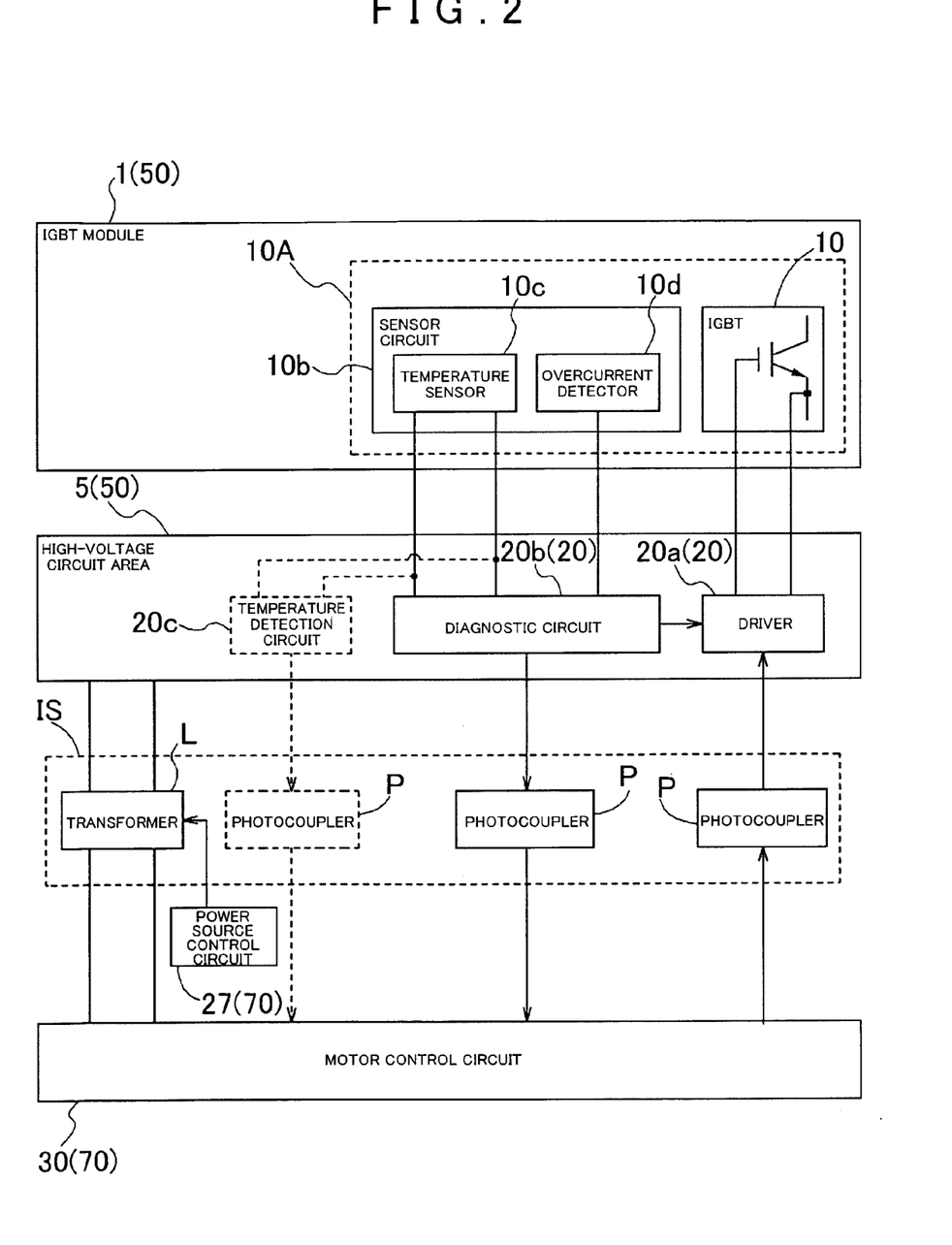
FIG. 2 is a block diagram schematically showing a form of wireless connection in an IGBT control board.
Figure 3:
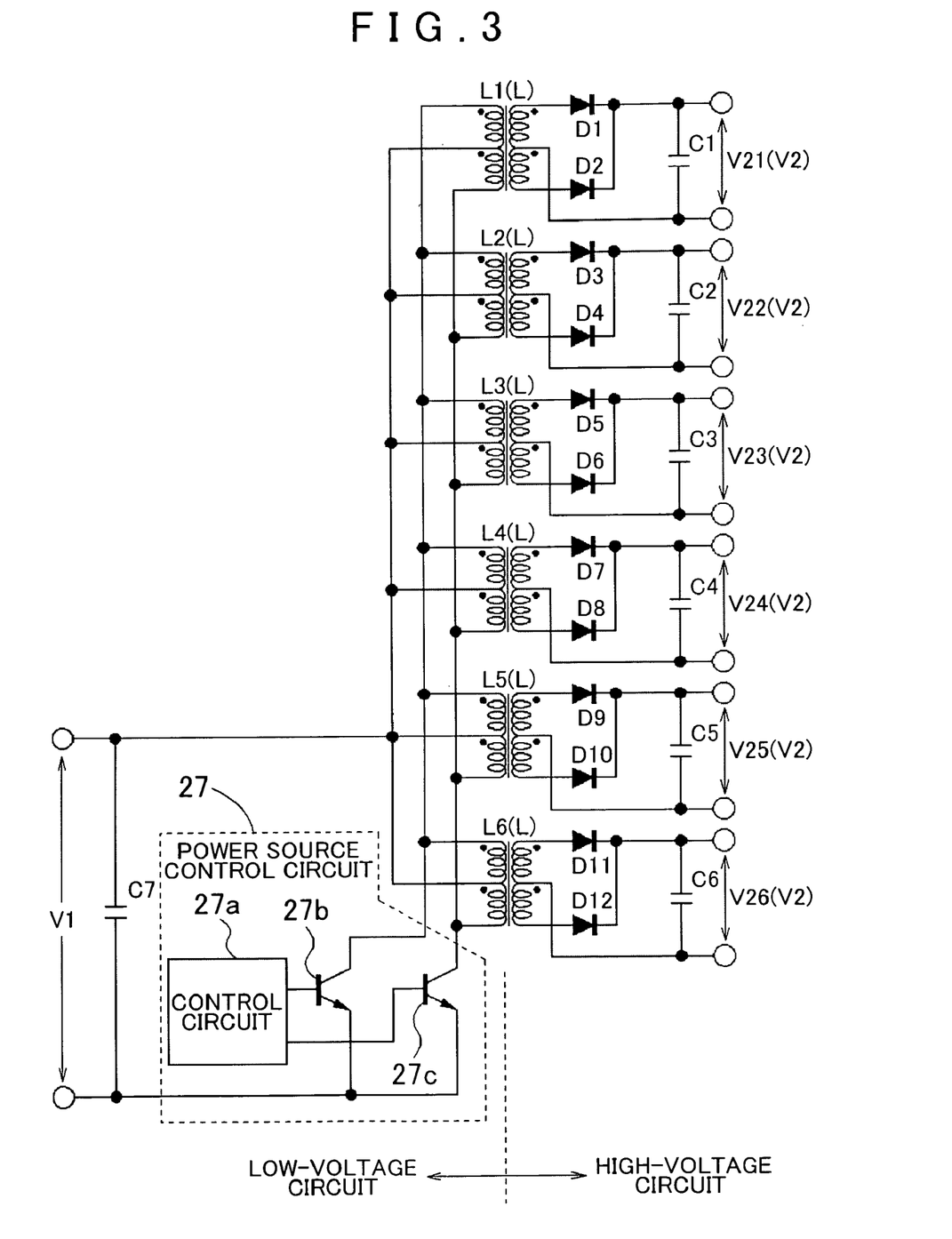
FIG. 3 is a block diagram schematically showing a configuration of a power supply circuit.

Embodiments according to the present invention will be described below with reference to the drawings. Referring to FIGS. 1 to 3, a circuit configuration of the motor control device will be explained first. FIG. 1 is a block diagram schematically showing a circuit configuration of the motor control circuit according to the present invention. As shown in FIG. 1, the motor control device for controlling a three-phase AC motor 9 (referred to as a motor below as appropriate) is structured having an IGBT module 1, an IGBT control board 2, and a motor control board 3.

The IGBT module 1 is formed with an inverter circuit that converts a direct current into a three-phase alternating current using an IGBT as a switching element. The inverter circuit, as FIG. 1 shows, is formed having six IGBTs 10 (and 11 to 16) and flywheel diodes 10a connected in parallel with the respective IGBTs 10. Note that the switching element is not limited to an IGBT, and the inverter circuit may also be structured using power transistors with various structures, such as a bipolar type, a field-effect type and a MOS type.

In the present embodiment, the inverter circuit has a module structure wherein the IGBT 10 and the flywheel diode 10a are mounted and integrated on a metal base via a ceramic insulating substrate. The inverter circuit is also formed with a sensor circuit 10*b* (see FIG. 2) for detecting an overcurrent in and overheating of the IGBT 10, which is integrated to structure the IGBT module 1. Further note that the inverter circuit may be formed by mounting the IGBT 10 and the flywheel diode 10*a* on an ordinary substrate.

In FIG. 1, respective arms of the inverter circuit are structured by one IGBT 10. However, due to limitations such as a current capacity of the IGBT, a plurality of IGBTs may be arranged in parallel to structure one arm. Particularly in the case of an inverter circuit with a module structure, the circuit may be formed by mounting a bare chip on a metal base via a ceramic insulating substrate, and bare chips of a plurality of IGBTs are often arranged in parallel to structure one arm. Accordingly, the IGBT (switching element) on one arm does not necessarily mean a single IGBT as shown in FIG. 1, and may indicate all the IGBTs connected in parallel on one arm. Furthermore, if one arm is formed by two IGBTs connected in parallel, then the two IGBTs may be controlled by one drive signal, or the respective IGBTs may be controlled by two drive signals.

A DC current with a positive-side voltage PV and a negative-side voltage NV (commonly a ground) is applied from a high-voltage battery 55 serving as a high-voltage power source to the IGBT module 1, and converted into three-phase AC currents U, V and W. In cases where the motor 9 is a motor for powering an electric vehicle or a hybrid vehicle, a DC voltage of several hundred volts is input to the IGBT module 1. As shown in FIG. 1, motor drive currents of the three phases, U-phase, V-phase and W-phase, are output from the IGBT module 1. These motor drive currents are output to the motor 9 via a cable, and connect with U-phase, V-phase and W-phase stator coils of the motor 9.

Formed on the motor control board 3 is a motor control circuit 30 that operates at a much lower voltage than the power supply voltage of the inverter circuit. A DC current of around 12 volts, for example, is supplied from a low-voltage battery 75 serving as a low-voltage power source to the motor control board 3. Note that the low-voltage power source is not limited to the low-voltage battery 75, and may be structured from a DC-DC converter that decreases the voltage of the high-voltage battery 55, or the like.

The motor control board 3 is structured from the motor control circuit 30, which controls the motor 9 in accordance with a command (external command) obtained by communication through a controller area network (CAN) or the like with an electronic control unit (ECU) (not shown) or the like that controls the running of a vehicle. The motor control circuit 30 generates a drive signal for driving the IGBT 10 on respective arms of the inverter circuit controlling the motor 9.

In the present embodiment, the switching element is an IGBT and a control terminal of the IGBT is a gate terminal. Therefore, the drive signal will be referred to as a gate drive signal. In addition, the motor control circuit 30 receives detection signals from a current sensor 91 and a rotation sensor 92, which detect behavior of the motor 9, and performs a feedback control depending on the operation status of the motor 9.

In FIG. 1, the current sensor 91 is provided between the IGBT module 1 and the motor 9; however, the current sensor 91 may be built into the IGBT module 1. In addition, only currents of the two phases, U-phase and V-phase, are measured in FIG. 1. A three-phase current of the U-phase, V-phase and W-phase is in a state of equilibrium and an instantaneous total sum thereof is zero. For this reason, a two-phase current is measured and the remaining one-phase current is found by computation. For the rotation sensor 92, a resolver may be used.

The motor control circuit 30 is formed with a microcomputer or digital signal processor (DSP) as a core component. An operating voltage of the microcomputer, DSP, or the like is generally 3.3 or 5 volts. Therefore, the motor control circuit 30 is also formed with a regulator circuit that generates an operating voltage from the 12-volt power supply voltage supplied from the low-voltage battery 75.

The IGBT control board 2 is structured from a gate drive circuit 20 that drives the IGBT 10 on respective arms of the inverter circuit, based on the gate drive signal generated in the motor control circuit 30. In addition, the IGBT control board 2 is provided with a power supply circuit that supplies generated power from a low-voltage DC power source in the motor control circuit 30 to the gate drive circuit. The power supply circuit is formed from a transformer L serving as an insulation part IS (see FIG. 2). As described in detail later, a photocoupler P that transmits the gate drive signal generated by the motor control circuit 30 to the gate drive circuit is mounted on the IGBT control board 2 and also serves as the insulation part IS (see FIG. 2). Furthermore, the IGBT control board 2 is also structured from a power source control circuit 27 for controlling the transformer L serving as the power supply circuit.

As described earlier in reference to FIG. 1, the inverter circuit formed on the IGBT module 1 is a high-voltage circuit 50 that operates at a high voltage, and the motor control circuit 30 formed on the motor control board 3 is a low-voltage circuit 70 that operates at a low voltage. The IGBT control board 2 has both the high-voltage circuit 50 connected with the IGBT module 1, and the low-voltage circuit 70 connected with the motor control board 3. As described in detail later, the high-voltage circuit 50 and the low-voltage circuit 70 are disposed on the IGBT control board 2 having a predetermined insulation distance therebetween. The high-voltage circuit 50 and the low-voltage circuit 70 have a wireless connection achieved by the insulation part IS as mentioned above.

FIG. 2 is a block diagram schematically showing a form of wireless connection in the IGBT control board 2. A form of wireless connection that corresponds to a circuit family 10A on one arm of the inverter circuit is shown here. Note that although FIG. 2 shows an example where one arm is formed having one circuit family 10A, as explained above, one arm may be formed including a plurality of IGBTs 10 and having a plurality of circuit families 10A.

The gate drive signal generated in the motor control circuit 30 associated with the low-voltage circuit 70 is connected with an input terminal of the photocoupler P, which is an insulation part IS mounted in the IGBT control board 2. An output terminal of the photocoupler P is connected with a driver 20*a* of the gate drive circuit 20, which is mounted in a high-voltage circuit area 5 of the IGBT control board 2 associated with the high-voltage circuit 50. The high-voltage circuit area 5 of the IGBT control board 2 will be described later. The photocoupler P is provided with an input-side light-emitting diode, and an output-side photodiode or phototransistor, and is a commonly known insulation part that uses light to wirelessly transmit a signal from the input side to the output side. Due to the photocoupler P, the gate drive signal is transmitted from the motor control circuit 30 to the gate drive circuit 20 while an insulated state is maintained between the low-voltage circuit 70 and the high-voltage circuit 50. The driver 20*a* of the gate drive circuit 20 drivingly controls the IGBT 10 of the IGBT module 1 associated with the high-voltage circuit 50.

Incidental to the above-described IGBT 10 is a sensor circuit 10*b* for detecting an overcurrent and overheating. As FIG. 2 shows, in the present example, the sensor circuit 10b is formed having a temperature sensor 10c and an overcurrent detector 10d. The temperature sensor 10c is a thermostat or a diode, and a change in voltage between terminals due to the temperature is detected by a diagnostic circuit 20b of the gate drive circuit 20. The overcurrent detector 10d, for example, detects a minute current proportional to a large current flowing through the IGBT 10, wherein the proportion is approximately $1/1,000,000$ to $1/100,000$, and thereby detects when the large current flowing through the IGBT 10 exceeds a predetermined value. A detection result thereof is received by the diagnostic circuit 20b.

The diagnostic circuit 20b determines an overheated state when the voltage between the terminals of the temperature sensor 10c falls below a predetermined value. If a detection result indicating an abnormality is received from the overcurrent detector 10d, then an overcurrent state caused by a short circuit or the like is determined. When at least one of either an overheated state or an overcurrent state is determined, the diagnostic circuit 20b outputs a diagnostic signal. Based on the diagnostic signal, the driver 20a controls the IGBT 10 to an off state regardless of the status of the gate drive signal received from the motor control circuit 30 via the photocoupler P.

The diagnostic signal is also transmitted to the motor control circuit 30. The diagnostic circuit 20b is part of the high-voltage circuit 50 formed in the high-voltage circuit area 5 of the IGBT control board 2. Accordingly, the diagnostic signal is wirelessly transmitted to the motor control circuit 30 via the photocoupler P serving as the insulation part IS. The cause of the abnormality, whether overheating, an overcurrent or the like, is not transmitted to the motor control circuit 30; however, it is possible to at least know that an abnormality has occurred. The motor control circuit 30 then performs processing to respond to the abnormality, such as processing to stop the motor 9.

As mentioned above, the voltage between the terminals of the temperature sensor 10c can be measured by the diagnostic circuit 20b. Therefore, a temperature detection circuit 20c that detects the temperature can be provided in the diagnostic circuit 20b or near the diagnostic circuit 20b. FIG. 2 shows an example where the temperature detection circuit 20c is provided near the diagnostic circuit 20b. There is no need to provide the temperature detection circuit 20c incidental to the gate drive circuit 20 that corresponds to all the arms of the inverter circuit, and a dashed line in FIG. 2 thus shows the temperature detection circuit 20c. The temperature detection circuit 20c is provided in the high-voltage circuit area 5 of the IGBT control board 2, and therefore the detection result is wirelessly transmitted to the motor control circuit 30 in a manner similar to the diagnostic signal via the photocoupler P serving as the insulation part IS.

As described above, the IGBT control board 2 is provided with a power supply circuit that supplies generated power from a low-voltage DC power source in the motor control circuit 30 to the gate drive circuit. FIG. 3 is a block diagram schematically showing a configuration of the power supply circuit. The power supply circuit will be explained below with reference to FIGS. 1 to 3.

The power supply circuit is formed from the transformer L serving as the insulation part IS. A primary voltage V1 is stabilized to a constant voltage in a voltage regulator circuit of the motor control circuit 30 (motor control board 3), that is, the low-voltage circuit 70, and supplied to the transformer L. Although the motor control board 3 is supplied with a 12-volt power supply voltage, for example, as mentioned above, the voltage of the battery 75 fluctuates depending on a load. Hence, using a step-up regulator or a step-down regulator to serve as the voltage regulator circuit, the constant voltage of the primary voltage V1 is raised to approximately 15 to 18 volts or lowered to approximately 8 to 10 volts, for example, and then supplied to the transformer L.

Regarding the transformer L, in the present embodiment, six transformers L1 to L6 are provided respectively corresponding to the six arms of the inverter circuit. Secondary voltages V21 to V26 are output from the transformers L1 to L6, respectively. The transformers L1 to L6 have practically identical structures and output secondary voltages V2 of approximately identical voltage. In FIG. 3, diodes D1 to D12 are rectifying diodes, condensers C1 to C6 are smoothing condensers, and a condenser C7 is a condenser for stabilizing the primary voltage.

The IGBT control board 2 is formed with the power source control circuit 27 associated with the low-voltage circuit 70, and controls the transformer L serving as the power supply circuit. The power source control circuit 27 is formed having transistors 27b and 27c that control a voltage applied by a primary-side coil, and a control circuit 27a that controls the transistors 27b and 27c. The power source control circuit 27 according to the present embodiment adopts a push-pull type configuration. Six transformers L are provided corresponding to the six arms of the inverter circuit, and the power source control circuit 27 collectively controls all the transformers L1 to L6. Also, as described above, the primary voltage V1 for the transformer L is stabilized, and therefore a secondary voltage V2 is determined by a ratio of transformation of the transformer L without the secondary voltage V2 being fed back to the primary side.

The transformer L is a commonly known insulation part that electromagnetically joins the primary-side coil and a secondary-side coil to transmit a signal and energy. Accordingly, a power supply voltage can be supplied to the gate drive circuit 20 and the like while maintaining insulation between the low-voltage circuit 70 and the high-voltage circuit 50.

Figure 4:
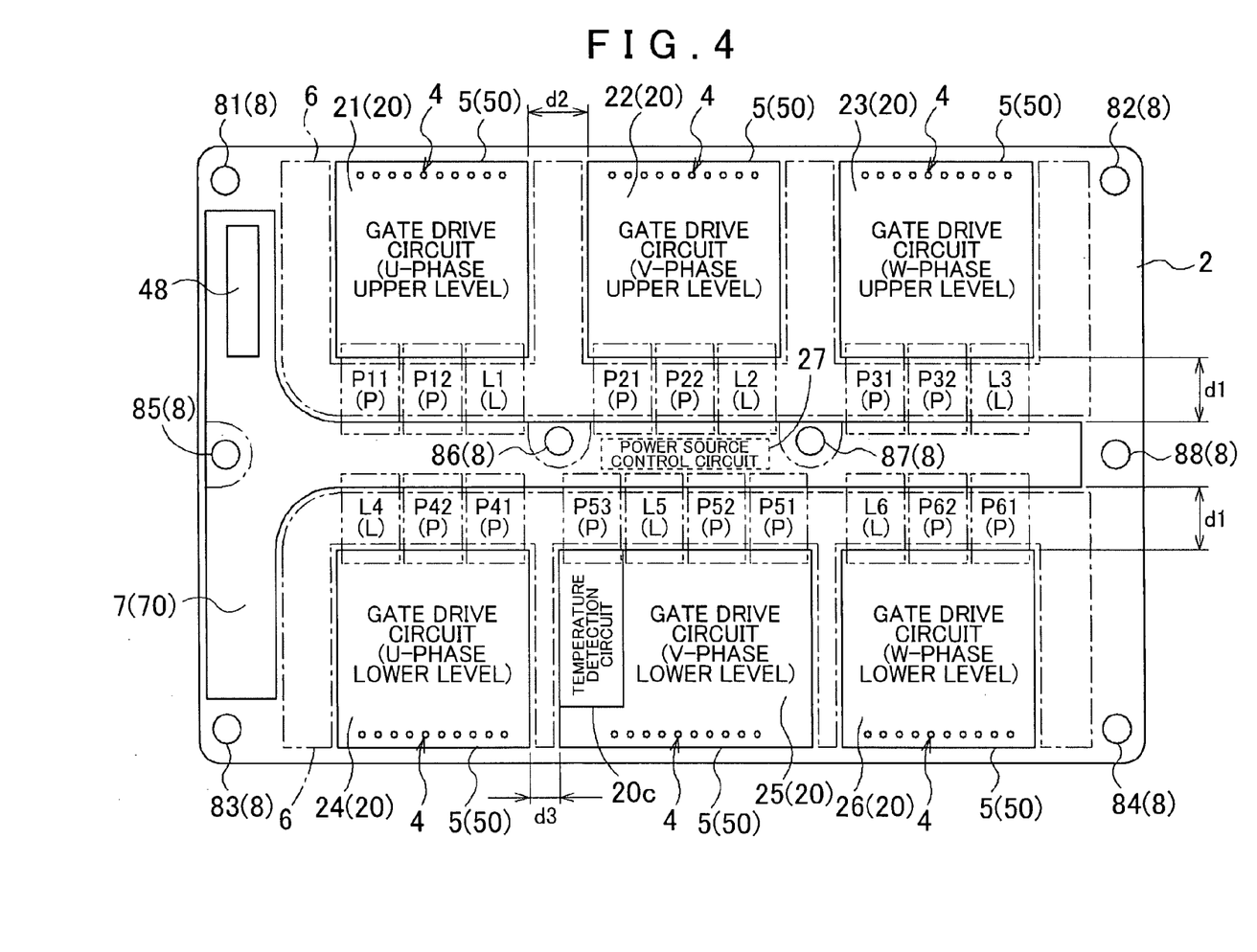
FIG. 4 is a layout drawing showing an example of a circuit layout of the IGBT control board.
Figure 5:
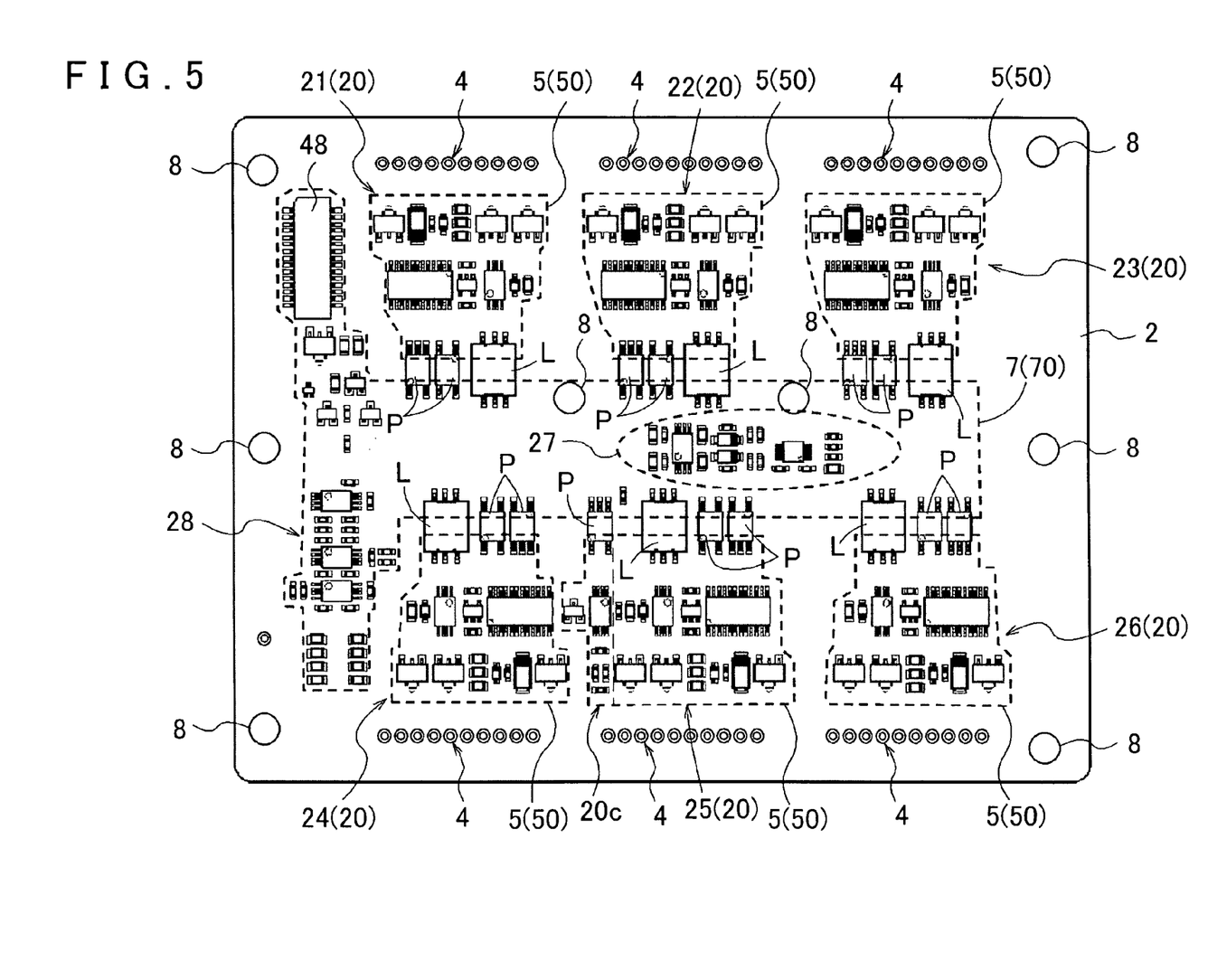
FIG. 5 is a layout drawing showing an example of a component layout on the IGBT control board.

As explained above, the IGBT control board 2 includes both the high-voltage circuit 50 and the low-voltage circuit 70, and maintains insulation therebetween by wirelessly joining both circuits using the insulation part IS. Referring to FIGS. 4 and 5, a specific layout of the IGBT control board 2 will be explained below. FIG. 4 is a layout drawing showing an example of a circuit layout of the IGBT control board 2, and FIG. 5 is a layout drawing showing an example of a specific component layout on the IGBT control board 2.

As FIGS. 4 and 5 illustrate, the IGBT control board 2 has a low-voltage circuit area 7 generally formed into a T shape whose head lies at the left side in the figures. A connector 48 is provided in the low-voltage circuit area 7 at the head of the T shape, i.e., the upper left side in the figures. The connector 48 is connected with the above-described motor control board 3 by a harness (not shown). The gate drive signal corresponding to respective arms of the inverter circuit is transmitted from the motor control circuit 30 to the low-voltage circuit area 7 of the IGBT control board 2 via the connector 48. The power supply voltage operating the power source control circuit 27 and the primary-side voltage V1 for the transformer L are also transmitted from the motor control board 3 via the connector 48. As shown in FIG. 5, a low-voltage circuit 28 is formed below the connector 48 in the figure, and a driver circuit and a receiver circuit are the input and output signals via the connector 48. Furthermore, the primary voltage for the transformer L may be generated in the low-voltage circuit 28.

The high-voltage circuit area 5 is also formed on the IGBT control board 2. Six high-voltage circuit areas 5 are formed corresponding to the respective arms of the inverter circuit.

The high-voltage circuit areas 5 as mentioned above have at least one gate drive circuit 20 for driving the IGBT 10 included on the respective arms. As shown in FIG. 2, in the present example, the gate drive circuit 20 and one circuit family 10A of one arm are connected by five signal wires. The IGBT module 1 has a terminal-connecting pin corresponding to these signal wires. The gate drive circuit 20 and the circuit family 10A are connected by solder welding the pin to a through hole 4 of the IGBT control board 2 as illustrated in FIGS. 4 and 5. Note that in the present embodiment, one arm of the inverter circuit is structured connecting two IGBTs 10 in parallel. In other words, one arm is provided with two circuit families 10A, and one gate drive circuit 20 is connected with two circuit families 10A. Therefore, one gate drive circuit 20 is provided with ten through holes 4.

Regarding the high-voltage circuit area 5, a plurality of high-voltage circuit areas 5 are disposed aligned on both sides (e.g. three to a side in the present example) of the low-voltage circuit area 7 such that a portion of the low-voltage circuit area 7 corresponding to the trunk portion of a T shape is provided therebetween. In such case, the gate drive circuit 20 is disposed with a predetermined insulation distance d1 provided between the gate drive circuit 20 and the low-voltage circuit area 7. The gate drive circuit 20 is further disposed with a predetermined insulation distance d2 or d3 provided between adjacent gate drive circuits 20.

By providing the predetermined insulation distance d1 between the gate drive circuit 20 and the low-voltage circuit area 7, an insulation area 6 is formed along the low-voltage circuit area 7. By further providing the predetermined insulation distance d2 or d3 between adjacent gate drive circuits 20, a comb-shaped insulation area 6 is formed on both sides of the low-voltage circuit area 7 with the trunk portion side of the T-shaped low-voltage circuit area 7 serving as a base portion thereof.

The transformers L1 to L6 serving as power supply circuits are provided straddling the insulation area 6 formed along the trunk portion of the T-shaped low-voltage circuit area 7, and the low-voltage circuit area 7 and the respective high-voltage circuit areas 5 are each joined in an insulated state. Namely, the primary-side voltage V1 is applied to the low-voltage circuit area 7 of the transformers L1 to L6, and the secondary-side voltage V2 is output to the high-voltage circuit areas 5 of the transformers L1 to L6. The high-voltage secondary-side voltage V2 only appears on the side of gate drive circuits 21 to 26 in the high-voltage circuit areas 5 corresponding to the transformers L1 to L6. Therefore, high-voltage wiring is not drawn out over a long distance within the IGBT control board 2. As a consequence, there is no need to increase the surface area of the insulation area 6, where no parts for securing insulation distance can be mounted, and the substrate can be effectively utilized.

The transformers L1 to L6 are controlled by a common power supply control circuit 27 formed on the low-voltage circuit area 7. It is thus possible to keep the surface area of the IGBT control board 2 down and achieve a more compact motor control device. In addition, as shown in FIGS. 4 and 5, the power source control circuit 27 is arranged at a general central portion among the plurality of transformers L1 to L6. Therefore, a maximum wire length among wiring connecting the power source control circuit 27 and the transformers L1 to L6, e.g. a wire length to the transformer L4 or L3, can be shortened.

A longer wire tends to generate more noise; however, since the maximum wiring length can be kept shorter, noise generation can be suppressed as well. Naturally, it is also possible to suppress the total wiring length that is the sum of the wiring lengths to the transformers L1 to L6. A larger amount of wiring tends to generate more noise, but keeping the total wiring length down can help suppress noise generation.

Moreover, since the wiring lengths from the power source control circuit 27 to the transformers L1 to L6 are uniform, it is possible to uniform power source characteristics of the secondary-side voltage V2 (V21 to V26) of the transformers L1 to L6, whereby the operation of the gate drive circuit 20 and the inverter circuit can be stabilized.

The photocouplers P (P11, P21, P31, P41, P51, P61) serving as insulation parts for signal transmission are provided straddling the insulation area 6 formed along the trunk portion of the T-shaped low-voltage circuit area 7. These photocouplers P are disposed aligned with the transformers L1 to L6 along a boundary line where the low-voltage circuit area 7 and the high-voltage circuit area 5 face one another. Since the insulation parts IS that connect the low-voltage circuit area 7 and the high-voltage circuit area 5 are disposed arranged in a row, providing the minimum required insulation area 6 on the IGBT control board 2 is sufficient.

Due to the photocouplers P, gate drive signals generated by the motor control circuit 30 and corresponding to the respective arms are joined between the low-voltage circuit area 7 and the high-voltage circuit areas (gate drive circuits 21 to 26) in an insulated state. In other words, gate drive signals generated at a power supply voltage lower than the power supply voltage of the inverter circuit are wirelessly transmitted from the low-voltage circuit area 7 to the respective gate drive circuits 21 to 26 of the high-voltage circuit area 5. The gate drive signals are transmitted from the gate drive circuits 21 to 26 to the IGBTs 10, whereby the IGBTs 10 are controlled.

Additional photocouplers P (P12, P22, P32, P42, P52, P62) serving as insulation parts for signal transmission are also provided straddling the insulation area 6 formed along the trunk portion of the T-shaped low-voltage circuit area 7. A feedback signal sent from the inverter circuit to the respective drive circuits 21 to 26 by the photocouplers P is wirelessly transmitted from the high-voltage circuit area 5 to the low-voltage circuit area 7.

These photocouplers P are disposed aligned with the transformers L1 to L6 and the photocouplers P (P11, P21, P31, P41, P51, P61) that transmit the gate drive signal, along a boundary line where the low-voltage circuit area 7 and the high-voltage circuit area 5 face one another. Since the insulation parts IS that connect the low-voltage circuit area 7 and the high-voltage circuit area 5 are disposed arranged in a row, providing the minimum required insulation area 6 on the IGBT control board 2 is sufficient. When increasing insulation performance by providing a slit in the insulation area 6 on the IGBT control board 2, linear processing on a lower surface of the transformer L and the photocoupler P, i.e., the insulation area 6 along the boundary line enables the formation of a slit.

As described above, the gate drive circuit 20 is provided corresponding to the respective arms of the inverter circuit. The correspondence between the gate drive circuit 20 and the respective arms will be explained below, wherein an arm connected with the positive-side voltage PV from the DC power source of the inverter circuit is referred to as an upper-level arm, and an arm connected with the negative-side voltage NV is referred to as a lower-level arm.

The IGBT 11 on a U-phase upper-level arm is driven by the gate drive circuit 21; the IGBT 12 on a V-phase upper-level arm is driven by the gate drive circuit 22; the IGBT 13 on a W-phase upper-level arm is driven by the gate drive circuit 23; the IGBT 14 on a U-phase lower-level arm is driven by the gate drive circuit 24; the IGBT 15 on a V-phase lower-level arm is driven by the gate drive circuit 25; and the IGBT 16 on a W-phase lower-level arm is driven by the gate drive circuit 26. The gate drive circuits 21 to 23 are referred to as upper-level gate drive circuits (upper-level drive circuits), and the gate drive circuits 24 to 26 are referred to as lower-level gate drive circuits (lower-level drive circuits) below as appropriate.

As FIGS. 4 and 5 illustrate, among the gate drive circuits 21 to 26, the upper-level gate drive circuits 21 to 23 driving the IGBTs 11 to 13 on the upper-level arms are arranged aligned on a side of the low-voltage circuit area 7, namely, an upper side in the figures. The lower-level gate drive circuits 24 to 26 driving the IGBTs 14 to 16 on the lower-level arms are arranged aligned on another side of the low-voltage circuit area 7, namely, a lower side in the figures.

As shown in FIG. 1, in the inverter circuit, the IGBTs 11 to 13 on the upper-level arms are connected with the positive-side voltage PV of the DC power source, and the IGBTs 14 to 16 on the lower-level arms are connected with the negative-side voltage NV of the DC power source. Arranging the IGBTs 11 to 13 on the upper-level arms and the IGBTs 14 to 16 on the lower-level arms in respective rows thus facilitates connection with the positive-side voltage PV and the negative-side voltage NV. As a consequence, arranging the drive circuit 20 driving the IGBT 10 according to the respective rows of the upper-level gate drive circuits 21 to 23 and the lower-level gate drive circuits 24 to 26 also helps enable efficient wiring.

As explained above, the gate drive circuit 20 is disposed with the predetermined insulation distance d2 or d3 provided between adjacent gate drive circuits 20. Specifically, the upper-level gate drive circuits 21 to 23 are disposed with the predetermined insulation distance d2 provided between adjacent gate drive circuits, and the lower-level drive circuits 24 to 26 are disposed with the predetermined insulation distance d3 provided between adjacent gate drive circuits. Here, the insulation distance d2 is a longer distance than the insulation distance d3 (see FIG. 4). In other words, the insulation distance d2 provided between adjacent upper-level gate drive circuits 21 to 23 is set longer than the insulation distance d3 provided between adjacent lower-level gate drive circuits 24 to 26.

For the IGBTs 11 to 13 on the upper-level arms connected with the high positive-side voltage PV among the DC power source voltage of the inverter circuit, a potential of an emitter terminal when in an on state increases to near the voltage PV. Since the IGBTs 14 to 16 on the lower-level arms are connected with the low negative-side voltage NV (commonly a ground), the emitter terminal when in an on state is the negative-side voltage NV.

As FIGS. 1 and 2 show, the gate drive circuit 20 drives the IGBT 10 by controlling a difference in potential between two terminals, the emitter terminal and the gate terminal of the IGBT 10. Thus, the potential of the upper-level gate drive circuits 21 to 23 connected with the IGBTs 11 to 13 on the upper-level arms increases to near the voltage PV when the IGBTs 11 to 13 are in an on state. Hence, by setting the insulation distance d2 to a longer distance than the insulation distance d3, a sufficient insulation distance is secured between the upper-level gate drive circuits 21 and 22, and 22 and 23. Note that the insulation distance for the lower-level gate drive circuits 24 to 26 is not limited provided that a minimum insulation distance is secured for ensuring that a large current flowing through the wiring of a potential NV in the IGBT module 1 does not flow in via the through hole 4.

Reference numeral 8 in FIGS. 4 and 5 indicates a through hole through which a fixing member for fixing the IGBT control board 2 runs. A metal bolt, for example, is used for the fixing member. A common structure is one in which through holes 81 to 84 for fixing the substrate are provided at the four corners of the IGBT control board 2. In the present embodiment, four through holes 85 to 88 are further provided. These four through holes 85 to 88 are provided in the vicinity of a center line of the oblong substrate.

Since a large current flows through the high-voltage circuit area 5, the transformer L, and the like, the IGBT control board 2 tends to become heated, and there is a risk of deformation such as warping occurring on the substrate due to excessive heating. However, by also providing the through holes 85 to 88 at a central portion of the substrate in addition to the through holes 81 to 84 at the four corners of the substrate, it is possible to suppress warping and reliably fix the IGBT control board 2. Moreover, a high vibration resistance required for in-vehicle use can be secured.

The through holes 85 to 87 are provided within the constant-voltage circuit area 7 with a predetermined insulation distance secured. In cases where a metal bolt is used as the fixing member, by providing the through hole 8 through which the bolt runs within the low-voltage circuit area 7 rather than the high-voltage circuit area 5, insulation can be secured with the use of a short insulation distance. In other words, providing more through holes 8 than normally used makes it possible to suppress an increase in the surface area of the substrate.

In addition, the through holes 86 and 87 are provided within the low-voltage circuit area 7 and disposed more toward one side of the high-voltage circuit areas 5, which are disposed aligned on both sides of the low-voltage circuit area 7 such that the low-voltage circuit area 7 is provided therebetween. As FIG. 5 shows, the power source control circuit 27 and the like can be disposed at suitable positions without interfering with the mounting of components on the low-voltage circuit area 7.

In the present embodiment, the through holes 86 and 87 are provided within the low-voltage circuit area 7 towards the upper-level gate drive circuits 21 to 23 side, as shown in FIGS. 4 and 5. The reason for this will be explained below.

As mentioned above, the high-voltage circuit area 5 where the lower-level gate drive circuits 24 to 26 are provided may have a shorter insulation distance than that of the upper-level gate drive circuits 21 to 23. Therefore, more components can be mounted in these high-voltage circuit areas 5 compared to the high-voltage circuit areas 5 provided with the upper-level gate drive circuits 21 to 23 in an amount corresponding to the reduced insulation area. For example, additional circuits such as a temperature detection sensor 20c can be provided in the high-voltage circuit area 5 along with the lower-level gate drive circuits 24 to 26.

When the output of an additional circuit in the high-voltage circuit area 5 is transmitted to the low-voltage circuit area 7 and transferred to the motor control circuit 30 via the connector 48, a control can be achieved in the motor control circuit 30 that uses a processing result of the additional circuit. In order to transmit the output of the additional circuit from the lower-level gate drive circuits 24 to 26 to the low-voltage circuit area 7, a signal-transmitting insulation part such as a photocoupler must be mounted straddling the insulation area 6. Providing the through holes 86 and 87 toward the lower-level gate drive circuits 24 to 26 side takes up space that could be used for mounting such an additional signal-transmitting insulation part. However, by providing the through holes 86 and 87 toward the upper-level gate drive circuits 21 to 23 side, a space is secured for mounting an additional signal-transmitting insulation part.

Furthermore, as FIGS. 4 and 5 show, the through holes 86 and 87 are preferably disposed toward the upper-level gate drive circuits 21 to 23 within the low-voltage circuit area 7, and also arranged at a positions along the insulation area 6 between the gate drive circuits 21 and 22 and between the gate drive circuits 22 and 23. Even if the through holes 86 and 87 are provided toward the upper-level gate drive circuits 21 to 23 side, a sufficient insulation distance is secured between the upper-level gate drive circuits 21 to 23.

The present embodiment illustrated an example where a temperature detection circuit 20c, which detects the temperature of the IGBT 15 based on a detection result of the temperature sensor 10c detecting the temperature of at least one IGBT 15, is provided in the high-voltage circuit area 5 along with the lower-level gate drive circuit 25. In a state with no abnormal excessive heating, all the IGBTs 10 exhibit similar temperature increase trends. Therefore, measuring the temperature of any one of the IGBTs 10 is sufficient. In addition, a difference due to the placement of the IGBT 10 can be corrected in the motor control circuit 30 by preparing in advance a map or the like for correcting an error caused by placement.

The detection result of the temperature detection circuit 20c is transmitted from the gate drive circuit 25 of the high-voltage circuit area 5 to the low-voltage circuit area 7. As shown in FIG. 4, the photocoupler P (P53) serving as a signal-transmitting insulation part is provided straddling the insulation area 6 formed along the low-voltage circuit area 7. The photocoupler P53 is disposed aligned with the transformer L5 and the photocouplers P51, P52 of the gate drive circuit 25 provided with the temperature detection circuit 20c, along the boundary line where the low-voltage circuit area 7 and the high-voltage circuit area 5 face one another.

In the present embodiment, the through holes 86 and 87 are provided within the low-voltage circuit area 7 towards the upper-level gate drive circuits 21 to 23 side, as shown in FIGS. 4 and 5. Therefore, a space for mounting the photocoupler P53, i.e., an additional signal-transmitting insulation part, can be well secured.

In this manner, four insulation parts IS the connect the low-voltage circuit area 7 and the high-voltage circuit area 5 are disposed arranged in a row. Accordingly, mounting the photocoupler P53 does not increase the surface area of the insulation, area 6 of the IGBT control board 2. Also, as explained above, when increasing insulation performance by providing a slit in the insulation area 6 on the IGBT control board 2, linear processing on a lower surface of the transformer L and the photocoupler P, i.e., the insulation area 6 along the boundary line, enables the formation of a slit.

As described using the specific layout above, the IGBT control board 2 includes both the high-voltage circuit 50 and the low-voltage circuit 70, and maintains insulation therebetween by wirelessly joining both circuits using the insulation part IS. Therefore, insulation is secured with a small insulation area 6, whereby a compact size is achieved. Accordingly, it is possible to provide a control device for an AC motor that is capable of securing insulation between a low-voltage circuit and a high-voltage circuit, while also achieving a compact size.

The present invention can be applied to a motor control device that controls an AC motor used for powering an electric vehicle, hybrid vehicle, or the like.

According to an exemplary aspect of the invention, the drive circuits are disposed aligned on both sides of the low-voltage circuit area such that the low-voltage circuit area having the power source control circuit is provided therebetween. Power is supplied to the drive circuit via the transformer, which respectively joins the low-voltage circuit area and the high-voltage circuit areas in an insulated state. The power supplied to the drive circuit has a high voltage, and the high voltage appears on the high voltage circuit area side of the transformer. Therefore, high-voltage wiring is not drawn out over a long distance within a substrate.

As a consequence, it is possible to decrease the surface area of an insulation area, where no parts for securing insulation distance can be mounted, and the substrate can be effectively utilized. The transformers connected to the drive circuits can also be controlled by a shared power source control circuit formed in the low-voltage circuit area. There is thus no need to individually provide power source control circuits with respect to the transformers, making it possible to simplify the power source control circuit. It is thus possible to keep the surface area of the substrate down and achieve a more compact motor control device. By providing the transformer, which is a heat-generating part, in a dispersed manner with respect to the drive circuits, the concentration of heat is less prone to occur and is an easy countermeasure against heat radiation.

According to an exemplary aspect of the invention, the switching element included on the arms of the inverter circuit is driven so as to switch at a timing that differs for each arm. The drive circuit drives the switching element by controlling a difference in potential between two terminals, i.e., a gate terminal and a base terminal, or a source terminal and an emitter terminal, of the switching element. Since a DC power source voltage of the inverter circuit is extremely high, the difference in potential between two terminals for driving the switching element is a higher voltage than the power source voltage in the low-voltage circuit area. Also, when the switching element is in an on state, a voltage of the drive signal changes depending on the DC power source voltage connected with the switching element. As mentioned above, due to the different timings at which the drive signal is output from adjacent drive circuits, the change in the voltage of the drive signal also varies, thus generating a large difference in potential between the drive signals output from adjacent drive circuits. As a consequence, insulation must be secured between adjacent drive circuits, and adjacent drive circuits are preferably disposed with a predetermined insulation distance provided as in the present structure.

According to an exemplary aspect of the invention, in the inverter circuit, the switching element on the upper-level arm is connected with a positive side of the DC power source, and the switching element on the lower-level arm is connected with a negative side of the DC power source. Arranging the switching element on the upper-level arm and the switching element on the lower-level arm in respective rows thus facilitates connection with a positive-side voltage and a negative-side voltage. Accordingly, arranging the drive circuit driving the switching element according to the respective rows of the upper-level drive circuits and the lower-level drive circuits also helps enable efficient wiring. As a consequence, a more compact motor control device can be achieved.

According to an exemplary aspect of the invention, for the switching element on the upper-level arm connected with the positive side of the DC power source voltage of the inverter circuit, a potential of the emitter terminal or source terminal when in an on state increases to roughly a positive-side potential. Since the switching element on the lower-level arm is connected with the low-voltage negative side (commonly a ground), the emitter terminal or the source terminal when in an on state is a negative-side potential. The drive circuit in general drives the switching element by controlling a difference in potential between two terminals, i.e., the gate terminal and the base terminal, or the source terminal and the emitter terminal, of the switching element. Therefore, the potential of the upper-level drive circuit connected with the switching element of the upper-level arm increases to near the positive-side power source voltage of the inverter circuit when the switching element is in an on state. According to the present structure, by setting an insulation distance provided between adjacent upper-level drive circuits longer than an insulation distance provided between adjacent lower-level drive circuits, a sufficient space is secured between upper-level drive circuits. Meanwhile, the lower-level drive circuits can be arranged using a minimum insulation distance for ensuring that a large current flowing through the inverter circuit does not flow in, whereby the surface area of the substrate can be kept small.

According to an exemplary aspect of the invention, more components can be mounted in the high-voltage circuit area for the lower-level drive circuit having a short insulation distance compared to the high-voltage circuit area for the upper-level drive circuits. Therefore, a substrate with a higher mounting efficiency can be formed by providing the temperature detection circuit in the high-voltage circuit area for the lower-level drive circuit. As a consequence, a more compact motor control device can be achieved.

According to an exemplary aspect of the invention, the high-voltage circuit areas are disposed aligned on both sides of the low-voltage circuit area, and an insulation area is formed on both sides of the low-voltage circuit area. In other words, the insulation area is formed along a boundary line where the low-voltage circuit area and the high-voltage circuit area face one another, and the transformer and the signal-transmitting insulation part are disposed along the boundary line. The insulation parts connecting the high-voltage circuit area and the low-voltage circuit area are disposed aligned in a row along with the transformer in the insulation area already provided. There is thus no need to increase the surface area of the substrate for transmitting the detection result of the temperature detection circuit to the low-voltage circuit area, making it possible to provide a control device for an AC motor capable of achieving a compact size.

According to an exemplary aspect of the invention, since the high-voltage circuit areas are aligned on both sides of the low-voltage circuit area, the low-voltage circuit area is disposed at a central portion of the substrate. The substrate commonly has a generally oblong shape, and a through hole through which a fixing member such as a bolt for fixing the substrate is provided at the four corners the substrate. According to the present characteristic structure, a through hole is also further provided in the low-voltage circuit area disposed in the central portion of the substrate. Since a large current flows through the high-voltage circuit area, the transformer, and the like, the substrate tends to become heated, and there is a risk of deformation such as warping occurring on the substrate due to excessive heating. However, by also providing the through hole at the center portion of the substrate as in the present characteristic structure, it is possible to suppress warping and reliably fix the substrate. A metal bolt is often used as the fixing member. By providing the through hole through which the fixing member runs in the low-voltage circuit area, insulation can be secured with the use of a short insulation distance, and a high vibration resistance required for in-vehicle use can also be secured. It is thus possible to suppress an increase in the surface area of the substrate as a result of providing the through hole. Since the through hole is provided toward the upper-level drive circuit side within the high-voltage circuit area, with the plurality of high-voltage circuit areas disposed aligned on both sides of the low-voltage circuit area such that the low-voltage circuit area is provided therebetween, the power source control circuit and the like can be disposed at suitable positions without interfering with the mounting of components on the low-voltage circuit area.

According to an exemplary aspect of the invention, more components can be mounted in the high-voltage circuit area for the lower-level drive circuit for which a short insulation distance may be used compared to the high-voltage circuit area for the upper-level drive circuits. For example, an additional circuit such as the temperature detection circuit can be provided in the high-voltage circuit area along with the lower-level drive circuit. When the output of an additional circuit in the high-voltage circuit area is transmitted to the low-voltage circuit area, a control can be achieved in a control circuit that uses a processing result of the additional circuit. Therefore, a transmission component may be mounted between the lower-level drive circuit and the low-voltage circuit area. Providing the through hole toward the upper-level drive circuit side makes it possible to secure a space for providing such a transmission part between the lower-level drive circuit and the low-voltage circuit area. This is preferred because there is consequently no increase in the surface area of the substrate as a result of providing the additional circuit.

According to an exemplary aspect of the invention, the low-voltage circuit area and the high-voltage circuit area are separated by a predetermined insulation distance, where an insulation area is formed. As described above, the high-voltage circuit areas are disposed aligned on both sides of the low-voltage circuit area such that the low-voltage circuit area is provided therebetween. Accordingly, the insulation area is formed on both sides of the low-voltage circuit area such that the low-voltage circuit area is provided therebetween. In other words, the insulation area is formed along a boundary line where the low-voltage circuit area and the high-voltage circuit area face one another, and the transformer and the signal-transmitting insulation part are disposed along the boundary line. Since the insulation parts that join the low-voltage circuit area and the high-voltage circuit area in an insulated state are disposed arranged in a row, providing the minimum required insulation area is sufficient. It is thus possible to provide a control device for an AC motor that is capable of securing insulation between the low-voltage circuit area and the high-voltage circuit area, while also achieving a compact size.

According to an exemplary aspect of the invention, in cases where the signal-transmitting insulation part that transmits the detection result of the temperature detection circuit as described above is provided, it is possible to arrange the signal-transmitting insulation part that transmits the drive signal, the signal-transmitting insulation part that transmits the detection result of the temperature detection circuit, and the transformer in a row along the boundary line of the insulation area already provided. It is thus possible achieve a more compact motor control device without increasing the surface area of the substrate.

According to an exemplary aspect of the invention, the high-voltage circuit areas are disposed aligned on both sides of the low-voltage circuit area, and the insulation area is formed on both sides of the low-voltage circuit area. In other words, the insulation area is formed along a boundary line where the low-voltage circuit area and the high-voltage circuit area face one another, and the transformer and the signal-transmitting insulation part are disposed along the boundary line. The insulation parts connecting the high-voltage circuit area and the low-voltage circuit area are disposed aligned in a row along with the transformer in the insulation area already provided. There is thus no need to increase the surface area of the substrate for transmitting the feedback signal to the low-voltage circuit area, making it possible to provide a control device for an AC motor capable of achieving a compact size.

According to an exemplary aspect of the invention, in cases where signal-transmitting insulation part that transmits the drive signal and the signal-transmitting insulation part that transmits the detection result of the temperature detection circuit as described above are provided, it is possible to arrange these signal-transmitting insulation parts, the signal-transmitting insulation part that transmits the feedback signal, and the transformer in a row along the boundary line of the insulation area already provided. It is thus possible achieve a more compact motor control device without increasing the surface area of the substrate.

According to an exemplary aspect of the invention, a maximum wire length among wiring connecting the power source control circuit and the transformers can be shortened, and a total wiring length can also be kept down. A longer wire tends to generate more noise; however, since the maximum wiring length can be kept shorter, noise generation can be suppressed as well. In addition, a larger amount of wiring tends to generate more noise, but keeping the total wiring length down can help suppress noise generation. Moreover, since the wiring lengths from the power source control circuit to the transformers are uniform, it is possible to uniform power source characteristics of a secondary-side voltage of the transformers, whereby the operation of the drive circuit and the inverter circuit can be stabilized.

According to an exemplary aspect of the invention, since the high-voltage circuit areas are aligned on both sides of the low-voltage circuit area, the low-voltage circuit area is disposed at a central portion of the substrate. The substrate commonly has a generally oblong shape, and a through hole through which a fixing member such as a bolt for fixing the substrate is provided at the four corners the substrate. According to the present characteristic structure, a through hole is also further provided in the low-voltage circuit area disposed in the central portion of the substrate.

Since a large current flows through the high-voltage circuit area, the transformer, and the like, the substrate tends to become heated, and there is a risk of deformation such as warping occurring on the substrate due to excessive heating. However, by also providing the through hole at the center portion of the substrate as in the present characteristic structure, it is possible to suppress warping and reliably fix the substrate. A metal bolt is often used as the fixing member. By providing the through hole through which the fixing member runs in the low-voltage circuit area, insulation can be secured with the use of a short insulation distance, and a high vibration resistance required for in-vehicle use can also be secured. It is thus possible to suppress an increase in the surface area of the substrate as a result of providing the through hole.

Since the through hole is provided toward any one side of the high-voltage circuit area, with the plurality of high-voltage circuit areas disposed aligned on both sides of the low-voltage circuit area such that the low-voltage circuit area is provided therebetween, the power source control circuit and the like can be disposed at suitable positions without interfering with the mounting of components on the low-voltage circuit area.

What is claimed is:

1. A motor control device comprising:
a plurality of drive circuits that are respectively provided on arms of an inverter circuit that supplies current to an AC motor, the plurality of drive circuits driving respectively a plurality of switching elements included on the arms;
a power source control circuit that performs a control of a plurality of power supply circuits that supply power respectively to the plurality of drive circuits;
a low-voltage circuit area that includes the power source control circuit;
a plurality of high-voltage circuit areas, each high-voltage circuit area including a drive circuit from the plurality of drive circuits; and
a plurality of transformers that serve as the plurality of power supply circuits and respectively join the low-voltage circuit area and the plurality of high-voltage circuit areas in an insulated state,
wherein the plurality of the high-voltage circuit areas are disposed aligned on both sides of the low-voltage circuit area such that the low-voltage circuit area is provided between the plurality of high-voltage areas and oriented with a predetermined insulation distance provided between the plurality of high-voltage circuit areas and the low-voltage circuit area.

2. The motor control device according to, claim 1, wherein each of the drive circuits from the plurality of drive circuits is oriented with a predetermined insulation distance provided between each of the drive circuits oriented adjacent to one another.

3. The motor control device according to claim 2, wherein:
a plurality of upper-level drive circuits comprised of a group of the plurality of drive circuits that drive each respective switching element on a plurality of upper-level arms connected with a positive side of a DC power source of the inverter circuit, which is arranged aligned on a side of the low-voltage circuit area, and
a plurality of lower-level drive circuits comprised of another group of the plurality of drive circuits that drive each respective switching element on a plurality of lower-level arms connected with a negative side of the DC power source of the inverter circuit, which is arranged aligned on another side of the low-voltage circuit area.

4. The motor control device according to claim 3, wherein an insulation distance provided between adjacent upper-level drive circuits is set longer than an insulation distance provided between adjacent lower-level drive circuits.

5. The motor control device according to, claim 4, further comprising:
a temperature detection circuit, which detects a temperature of a switching element based on a detection result of a temperature sensor detecting a temperature of at least one switching element, provided in the high-voltage circuit area along with the lower-level drive circuit.

6. The motor control device according to claim 5, further comprising:
a signal-transmitting insulation part that wirelessly transmits the detection result of the temperature detection circuit from the high-voltage circuit area to the low-voltage circuit area, wherein
the signal-transmitting insulation part is disposed aligned with a transformer in the high-voltage circuit area provided with the temperature detection circuit, along a boundary line where the low-voltage circuit area and the high-voltage circuit area face one another.

7. The motor control device according to claim 6, further comprising:
a through hole through which a fixing member for fixing a substrate runs, wherein
the through hole is provided within the low-voltage circuit area toward the upper-level drive circuit side.

8. The motor control device according to claim 6, further comprising:
signal-transmitting insulation parts that wirelessly transmit from the low-voltage circuit area to the high-voltage circuit area drive signals generated at a voltage lower than a power source voltage of the inverter circuit for driving each of the respective switching elements included on the arms, wherein
the signal-transmitting insulation parts are oriented aligned respectively with each of the transformers, along a boundary line where the low-voltage circuit area and the high-voltage circuit area face one another.

9. The motor control device according to claim 6, further comprising:
signal-transmitting insulation parts that wirelessly transmit a feedback signal from the inverter circuit to each of the respective drive circuits from the high-voltage circuit area to the low-voltage circuit area, wherein
the signal-transmitting insulation parts are disposed aligned with each of the respective transformers, along a boundary line where the low-voltage circuit area and the high-voltage circuit area face one another.

10. The motor control device according to claim 6, wherein the power source control circuit is arranged at a generally central portion among the plurality of the transformers.

11. The motor control device according to claim 1, further comprising:
signal-transmitting insulation parts that wirelessly transmit from the low-voltage circuit area to the high-voltage circuit area drive signals generated at a voltage lower than a power source voltage of the inverter circuit for driving each of the respective switching elements included on the arms, wherein
the signal-transmitting insulation parts are oriented aligned respectively with each of the transformers, along a boundary line where the low-voltage circuit area and the high-voltage circuit area face one another.

12. The motor control device according to claim 1, further comprising:
signal-transmitting insulation parts that wirelessly transmit a feedback signal from the inverter circuit to each of the respective drive circuits from the high-voltage circuit area to the low-voltage circuit area, wherein
the signal-transmitting insulation parts are disposed aligned with each of the respective transformers, along a boundary line where the low-voltage circuit area and the high-voltage circuit area face one another.

13. The motor control device according to claim 1, wherein the power source control circuit is arranged at a generally central portion among the plurality of the transformers.

14. The motor control device according to claim 1, further comprising:
a through hole through which a fixing member for fixing a substrate runs, wherein
the through hole is provided within the low-voltage circuit area toward any one side of the high-voltage circuit areas disposed aligned on both sides of the low-voltage circuit area such that the low-voltage circuit area is provided therebetween.

15. The motor control device according to claim 1, wherein:
a plurality of upper-level drive circuits comprised of a group of the plurality of drive circuits that drive each respective switching element on a plurality of upper-level arms connected with a positive side of a DC power source of the inverter circuit, which is arranged aligned on a side of the low-voltage circuit area, and
a plurality of lower-level drive circuits comprised of another group of the plurality of drive circuits that drive each respective switching element on a plurality of lower-level arms connected with a negative side of the DC power source of the inverter circuit, which is arranged aligned on another side of the low-voltage circuit area.

16. The motor control device according to claim 15, wherein an insulation distance provided between adjacent upper-level drive circuits is set longer than an insulation distance provided between adjacent lower-level drive circuits.

17. The motor control device according to claim 16, further comprising:
a temperature detection circuit, which detects a temperature of a switching element based on a detection result of a temperature sensor detecting a temperature of at least one switching element, provided in the high-voltage circuit area along with the lower-level drive circuit.

18. The motor control device according to claim 17, further comprising:
a signal-transmitting insulation part that wirelessly transmits the detection result of the temperature detection circuit from the high-voltage circuit area to the low-voltage circuit area, wherein
the signal-transmitting insulation part is disposed aligned with a transformer in the high-voltage circuit area provided with the temperature detection circuit; along a boundary line where the low-voltage circuit area and the high-voltage circuit area face one another.

19. The motor control device according to claim 18, further comprising:
a through hole through which a fixing member for fixing a substrate runs, wherein
the through hole is provided within the low-voltage circuit area toward the upper-level drive circuit side.

20. The motor control device according to claim 18, further comprising:
signal-transmitting insulation parts that wirelessly transmit from the low-voltage circuit area to the high-voltage circuit area drive signals generated at a voltage lower than a power source voltage of the inverter circuit for driving each of the respective switching elements included on the arms, wherein
the signal-transmitting insulation parts are oriented aligned respectively with each of the transformers, along a boundary line where the low-voltage circuit area and the high-voltage circuit area face one another.

* * * * *